(12) United States Patent
Ouyang

(10) Patent No.: US 11,393,850 B2
(45) Date of Patent: Jul. 19, 2022

(54) ARRAY SUBSTRATE AND DISPLAY PANEL

(71) Applicant: TCL CHINA STAR OPTOELECTRONICS TECHNOLOGY CO., LTD., Shenzhen (CN)

(72) Inventor: Xing Ouyang, Shenzhen (CN)

( * ) Notice: Subject to any disclaimer, the term of this patent is extended or adjusted under 35 U.S.C. 154(b) by 333 days.

(21) Appl. No.: 16/627,800

(22) PCT Filed: Dec. 26, 2019

(86) PCT No.: PCT/CN2019/128785
§ 371 (c)(1),
(2) Date: Dec. 31, 2019

(87) PCT Pub. No.: WO2021/120278
PCT Pub. Date: Jun. 24, 2021

(65) Prior Publication Data
US 2021/0366948 A1    Nov. 25, 2021

(30) Foreign Application Priority Data
Dec. 18, 2019    (CN) .......................... 201911310794.0

(51) Int. Cl.
*H01L 27/12*    (2006.01)
*G02F 1/1362*    (2006.01)

(52) U.S. Cl.
CPC .... *H01L 27/1244* (2013.01); *G02F 1/136286* (2013.01); *G09G 2300/0426* (2013.01)

(58) Field of Classification Search
CPC .......... H01L 27/1244; G02F 1/136286; G09G 2300/0426
USPC ................................... 349/149–152
See application file for complete search history.

(56) References Cited

U.S. PATENT DOCUMENTS

| | | | |
|---|---|---|---|
| 2003/0117536 A1 | 6/2003 | Jeon | |
| 2004/0004595 A1* | 1/2004 | Isami | G09G 3/3648 345/89 |
| 2006/0267914 A1* | 11/2006 | Chang | G02F 1/1345 345/100 |
| 2008/0173900 A1 | 7/2008 | Yoon et al. | |
| 2016/0274432 A1 | 9/2016 | Yao | |

FOREIGN PATENT DOCUMENTS

| | | |
|---|---|---|
| CN | 101231435 A | 7/2008 |
| CN | 103676382 A | 3/2014 |
| CN | 107632474 A | 1/2018 |
| CN | 107945726 A | 4/2018 |
| CN | 208999734 U | 6/2019 |

* cited by examiner

*Primary Examiner* — Charles S Chang

(57) ABSTRACT

The present application discloses an array substrate and a display panel, which includes gate on array (GOA) signal lines disposed in a film layer of the array substrate and driving signal lines disposed on a surface of the array substrate. The GOA signal lines are electrically connected to the driving signal lines by through holes. The through holes are correspondingly disposed on the GOA signal lines, and the through holes are disposed on the GOA signal lines according to an area ratio.

11 Claims, 3 Drawing Sheets

ARRAY SUBSTRATE AND DISPLAY PANEL

FIELD OF APPLICATION

The present application is related to the field of gate on array (GOA) display technology, and specifically to an array substrate and a display panel.

BACKGROUND OF APPLICATION

GOA products are based on manufacturing processes of liquid crystal display panels. Driving circuits of horizontal scan lines are made on substrates around display regions, so that it can replace products for driving external integrated circuits of the horizontal scan lines. Thin-film transistor (TFT) side circuit designs configure row driving functions on TFT substrates and form unique GOA circuits on the TFT substrates.

After analyzing burn marks on screens of the GOA products, causes of screen burn-in of the GOA products include, but are not limited to the following two types. A first type is that a TFT substrate and a color filter (CF) substrate are connected due to an influence of foreign objects. For example, the TFT substrate and the indium tin oxide (ITO) layer of the CF substrate are in contact with each other due to being pressed by the foreign objects. Because the foreign objects enter the TFT substrate and the ITO layer of the CF substrate, a possibility of causing electrostatic breakdown of the ITO layers on both sides formed by the foreign objects is greatly increased, and a possibility of conducting the TFT substrate and the CF substrate is increased. A second type is that a short-circuiting occurs between signal lines on the TFT substrate.

Everyone knows that the screen burn-in problem of the GOA products is a common phenomenon in an industry, which has not been effectively improved or completely solved. The present application analyzes the burn marks caused by the screen burn-in to obtain some of the above principles of the screen burn-in of the GOA products. According to the principles of abnormality, by reducing a possible conduction area between the TFT substrate and the CF substrate and reducing a possibility of causing the short-circuiting between the signal lines on the TFT substrate, a technical solution to improve the screen burn-in of the GOA products is proposed.

SUMMARY OF APPLICATION

Embodiments of the present application provide an array substrate, which solves a problem of screen burn-in caused by heat generated by a short-circuiting occurred in a region of gate on array (GOA) lines on the thin-film transistor (TFT) substrate due to foreign objects or a small region of film residue.

In a first aspect, the present application provides an array substrate including GOA signal lines disposed in a film layer of the array substrate and driving signal lines disposed on a surface of the array substrate. The GOA signal lines are electrically connected to the driving signal lines by through holes. The through holes are correspondingly disposed on the GOA signal lines, and the through holes are disposed on the GOA signal lines according to an area ratio.

With reference to the first aspect, a first embodiment of the first aspect, the through holes disposed on the GOA signal lines according to the area ratio includes: a ratio of an area of the through holes to an area of the GOA signal lines. The ratio of the area of the through holes to the area of the GOA signal lines is less than eight percent.

With reference to the first embodiment of the first aspect, in a second embodiment of the first aspect, the through holes disposed on the GOA signal lines according to the area ratio further includes: a ratio of an area occupied by the through holes in a unit area of the GOA signal lines to the unit area of the GOA signal lines. The ratio of the area occupied by the through holes on a plane in the unit area of the GOA signal lines to the unit area of the GOA signal lines is related to a positional relationship of the through holes in the unit area of the GOA signal lines.

With reference to the second embodiment of the first aspect, in a third embodiment of the first aspect, the positional relationship includes a lateral distance between adjacent through holes. The lateral distance is a horizontal distance between outer edges of the adjacent through holes, and the lateral distance is greater than 26 microns.

With reference to the second embodiment of the first aspect, in a fourth embodiment of the first aspect, the positional relationship further includes a longitudinal distance between adjacent through holes. The longitudinal distance is a vertical distance between outer edges of the adjacent through holes, and the longitudinal distance is greater than 19 microns.

With reference to the second embodiment of the first aspect, in a fifth embodiment of the first aspect, the positional relationship further includes a dislocation distribution of the through holes on adjacent rows when two or more rows of the through holes are disposed on a same GOA signal line.

With reference to any one of the above embodiments, in a sixth embodiment of the first aspect, the array substrate further includes film pillars disposed at ends of the through holes.

In a second aspect, the present application provides a display panel including any one of the above array substrates. The array substrate is bonded to a color filter substrate by a frame adhesive. A coating region of the frame adhesive and a wiring region of GOA signal lines are independent from each other on a projection plane.

The array substrate provided by the present application adjusts distances between the through holes on the GOA signal lines and the area occupied by the through holes on the GOA signal lines by determining the area ratio of the through holes on the GOA signal lines. It effectively reduces a possibility of the short-circuiting between adjacent through holes caused by foreign objects, which means that a possibility of causing the short-circuiting in the region of the GOA signal lines is reduced. In the display panel provided by the present application, the coating region of the frame adhesive does not overlap with the wiring region of the GOA signal lines, a possibility of the foreign objects falling off from the coating region entering the wiring region is reduced, and a possibility of the short-circuiting caused by the foreign objects in the wiring region, thereby reducing the screen burn-in.

DESCRIPTION OF DRAWINGS

The following describes specific embodiments of the present application in detail with reference to the accompanying drawings, which will make technical solutions and other beneficial effects of the present application obvious.

DETAILED DESCRIPTION OF PREFERRED EMBODIMENTS

Figure 1:
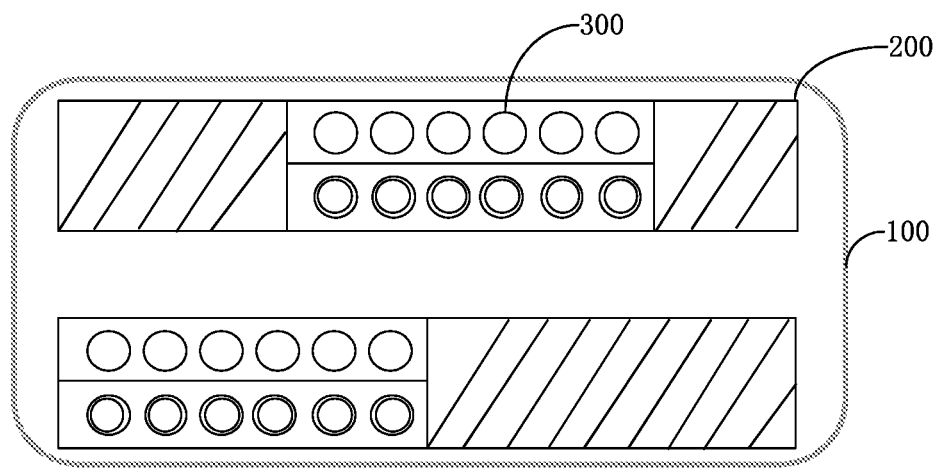
FIG. 1 is a structural diagram of an array substrate according to an embodiment of the present application.

To further explain the technical means and effect of the present application, the following refers to embodiments and drawings for detailed description. Obviously, the described embodiments are only for some embodiments of the present application, instead of all embodiments. Based on the embodiments of the present application, all other embodiments obtained by those skilled in the art without creative work fall into a protection scope of the present application.

Directional terms mentioned in the present application, such as upper, lower, front, rear, left, right, in, out, side, etc., only refer to directions in the accompanying drawings. Thus, the adoption of directional terms is used to describe and understand the present application, but not to limit the present application. In addition, the terms "first" and "second" are merely used for illustrative purposes only, but are not to be construed as indicating or imposing a relative importance or implicitly indicating the number of technical features indicated. Thus, a feature that defines "first" or "second" may expressly or implicitly include one or more of the features. In the description of the present application, the meaning of "plural" is two or more, unless otherwise specified.

In the present application, unless otherwise specifically stated and defined, terms "connected", "fixed", etc. should be interpreted expansively. For example, "fixed" may be fixed connection, also may be detachable connection, or integration; may be mechanical connection, also may be electrical connection; may be direct connection, also may be indirect connection through an intermediate, and may be internal communication between two elements or interaction of two elements, unless otherwise specifically defined. The ordinary skill in this field can understand the specific implication of the above terms in the present disclosure according to specific conditions.

In the present application, unless otherwise specifically stated and defined, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Various embodiments or examples are provided here below to implement the different structures of the present application. To simplify the disclosure of the present application, description of the components and arrangements of specific examples is given below. Of course, they are only illustrative and not limiting the present application. Moreover, in the present application, reference numbers and/or letters may be repeated in different embodiments. Such repetition is for the purposes of simplification and clearness, and does not denote the relationship between respective embodiments and/or arrangements being discussed. Furthermore, the present application provides various examples for specific process and materials. However, it is obvious for a person of ordinary skill in the art that other processes and/or materials may alternatively be utilized.

As shown in FIG. 1, the present application provides an array substrate 100 including gate on array (GOA) signal lines 200 disposed in a film layer of the array substrate 100 and driving signal lines disposed on a surface of the array substrate 100. The GOA signal lines 200 are electrically connected to the driving signal lines by through holes 300. The through holes 300 are correspondingly disposed on the GOA signal lines 200, and the through holes 300 are disposed on the GOA signal lines 200 according to an area ratio.

Specifically, according to functions to be implemented by the array substrate 100, the GOA signal lines 200, the driving signal lines, or the two signal lines located in different film layers need to be electrically connected across the film layers by the through holes 300. However, foreign objects easily pass through the through holes 300, resulting in connections between different film layers and connections between adjacent through holes 300. Therefore, a ratio of arranging the through holes 300 on the GOA signal lines 200 can adjust an arrangement of the through holes 300 on the GOA signal lines 200 or a distance between them, which effectively reduces a possibility of a short-circuiting between adjacent through holes 300 caused by foreign objects, and a possibility of causing the short-circuiting in a region of the GOA signal lines 200 is reduced.

In an embodiment, the area ratio is related to an area occupied by the through holes 300 and an area of the GOA signal lines 200. The area occupied by the through holes 300 is determined in the following way. For example, each of the through holes 300 is a circle, an outer radius of each of the through holes 300 is O, and a calculation formula for an area of each of the through holes 300 is $\pi*O^2$. The area occupied by the through holes 300 can be obtained by the sum of all the areas of each of the through holes 300. If shape of each of the through holes 300 is a rectangle, an area of each of the through holes 300 is its length times its width, and the area occupied by the through holes 300 can be obtained by the sum of all the areas of each of the through holes 300. Each of the GOA signal lines 200 has a length and a width, an area of each of the GOA signal lines 200 is obtained by the product of its length and its width, and the area occupied by the through holes 300 can be obtained by the product of all the areas of each of the through holes 300 and a number of the GOA signal lines 200. By adjusting the area ratio between the two, the arrangement of the through holes 300 on the GOA signal lines 200 can be limited. This arrangement can make certain restrictions on specific locations of the through holes 300, thereby reducing the possibility of the short-circuiting between adjacent through holes 300 caused by foreign objects. There are two kinds of area ratio relationships between the two, and both can achieve an intended purpose.

In an embodiment, the through holes 300 disposed on the GOA signal lines 200 according to the area ratio includes: a ratio of an area of the through holes 300 to an area of the GOA signal lines 200. The ratio of the area of the through holes 300 to the area of the GOA signal lines 200 is less than eight percent (8%).

Figure 2:
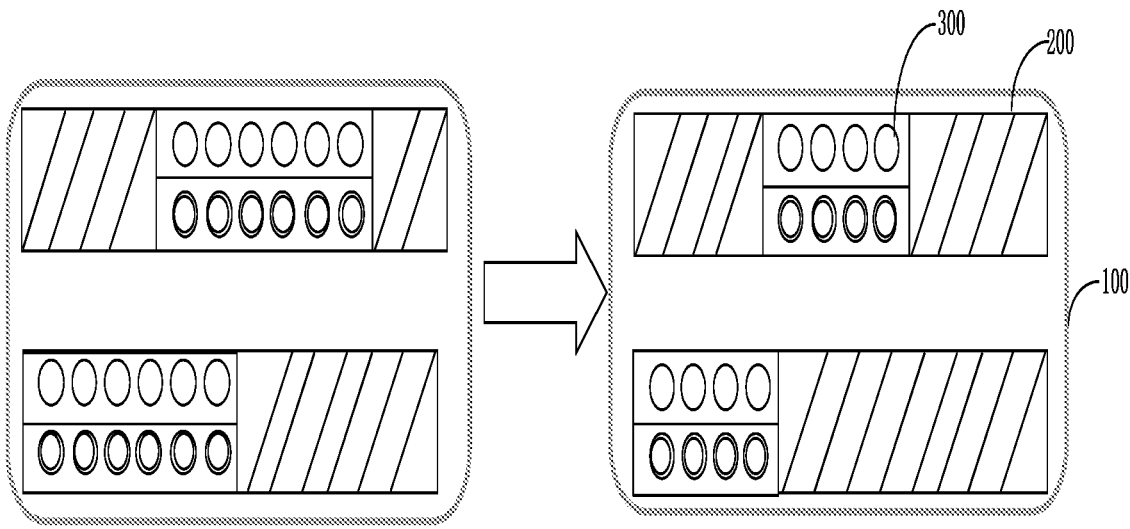
FIG. 2 is a structural diagram of comparison before and after a first improvement of the array substrate according to an embodiment of the present application.

Specifically, the area ratio is the ratio of the area of the through holes 300 to the area of the GOA signal lines 200. In a process of designing wiring diagrams, numbers, locations, and sizes of the through holes 300 should be determined according to needs of designs. Because the area of the through holes 300 is a numerator of the area ratio, the area ratio can be effectively reduced by reducing the area of the through holes 300. For example, as shown in FIG. 2, by optimizing the wiring design in different film layers, electrically connections the film layers are reduced, a number of the through holes 300 is reduced, which is a more effective and direct way to reduce the area ratio.

As shown in Table 1, possibilities of causing burn-in of different GOA products change as their ratios of the area of the through holes 300 to the area of the GOA signal lines 200 reduce. Regardless of influences of other factors on the possibilities of causing the burn-in, when a ratio of an area of the through holes 300 to an area of the GOA signal lines 200 of product 32B04 is 7.62%, its corresponding possibility of causing the burn-in is 0.01%, and the possibility of causing the burn-in has been significantly reduced and close to zero, thereby achieving a purpose of reducing the possibility of causing screen burn-in. Therefore, in this embodiment, the ratio of the area of the through holes 300 to the area of the GOA signal lines 200 is determined to be less than 8%, which is close to the ratio of the area of the through holes 300 to the area of the GOA signal lines 200 of product 32B04. At the same time, in products 55D07 and 32B03, it has also been verified. Ratios of the area of the through holes 300 to the area of the GOA signal lines 200 of products 55D07 and 32B03 are 3.59% and 2.93%, and their corresponding possibilities of causing the burn-in are both zero. In addition, as shown in Table 1, a ratio of an area of the through holes 300 to an area of the GOA signal lines 200 of product 65D02 is 15.63%, which is the greatest in Table 1, but a possibility of causing the burn-in of product 65D02 is the greatest as well. It can be seen that the ratio of the area of the through holes 300 to the area of the GOA signal lines 200 is directly related to the possibility of causing the burn-in, and the possibility of causing the burn-in can be reduced by reducing the ratio.

In an embodiment, the through holes 300 disposed on the GOA signal lines 200 according to the area ratio further includes: a ratio of an area occupied by the through holes 300 in a unit area of the GOA signal lines 200 to the unit area of the GOA signal lines 200. The ratio of the area occupied by the through holes 300 on a plane in the unit area of the GOA signal lines 200 to the unit area of the GOA signal lines 200 is related to a positional relationship of the through holes 300 in the unit area of the GOA signal lines 200.

Specifically, the ratio is used to determine the area occupied by the through holes 300 in the unit area of the GOA signal lines 200. The area ratio can adjust the positional relationship of the through holes 300. For example, when the area ratio is required to be below a certain fixed value, the unit area of the GOA signal lines 200 is a constant, then the area ratio can only be adjusted by changing the area of the through holes 300 in the unit area of the GOA signal lines 200. Specifically, in the process of designing the wiring diagrams, a distance between adjacent through holes 300 can be increased, thereby reducing arrangement density of the through holes 300 in the unit area of the GOA signal lines 200. In this way, difficulty of connecting the adjacent through holes 300 is increased, thereby reducing the possibility of causing the short-circuiting. Of course, the positional relationship of the through holes 300 is not limited to this example, and there are the following specific ways described below.

Figure 5:
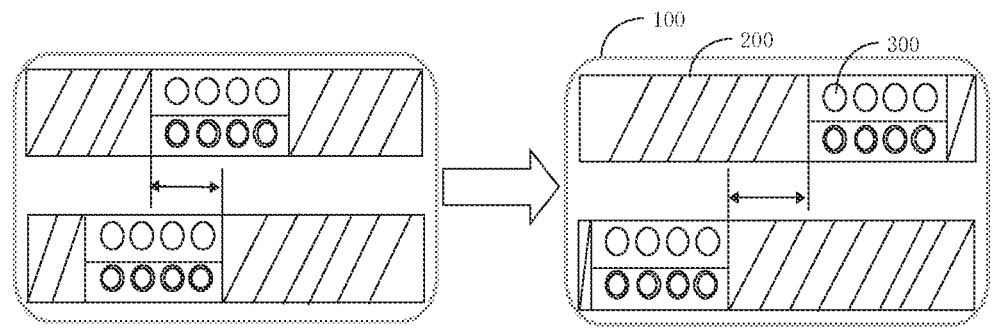
FIG. 5 is a structural diagram of comparison before and after a fourth improvement of the array substrate according to an embodiment of the present application.

As shown in FIG. 5, in an embodiment, the positional relationship includes a lateral distance between adjacent through holes 300. The lateral distance is a horizontal distance between outer edges of the adjacent through holes 300, and the lateral distance is greater than 26 microns.

Specifically, as shown in Table 1, dimensions of left and right spacing and top and bottom spacing of the GOA signal lines 200 are different for different products. Selecting left and right spacing of 26 microns of product 55D08 and top and bottom spacing of 19 microns as critical points to define a horizontal and a vertical distance. Base on the principles of the screen burn-in, it can be known that the greater the distance between the adjacent through holes 300 is, the less the possibility of causing the burn-in is. Therefore, the distance can be adjusted in the process of designing the wiring diagrams, and a possibility of causing connection between the adjacent through holes 300 is reduced.

Figure 6:
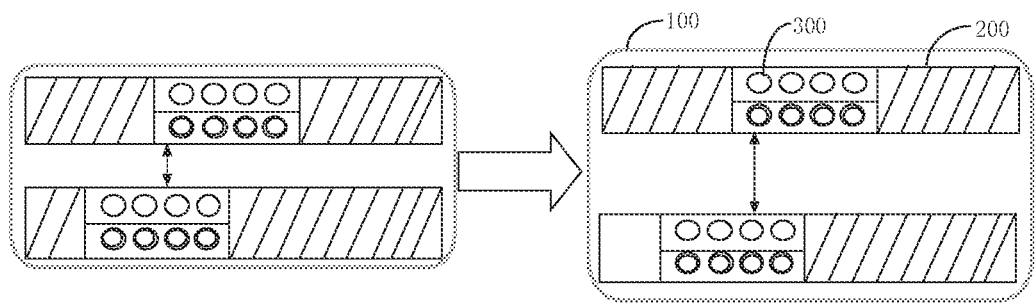
FIG. 6 is a structural diagram of comparison before and after a fifth improvement of the array substrate according to an embodiment of the present application.

As shown in FIG. 6, in an embodiment, the positional relationship further includes a longitudinal distance between adjacent through holes 300. The longitudinal distance is a vertical distance between outer edges of the adjacent through holes 300, and the longitudinal distance is greater than 19 microns.

Specifically, this embodiment is similar to a principle of arranging the lateral distance. Adjusting the distance between adjacent through holes 300 in another way can achieve similar implementation effects, which is not be described herein again.

Figure 4:
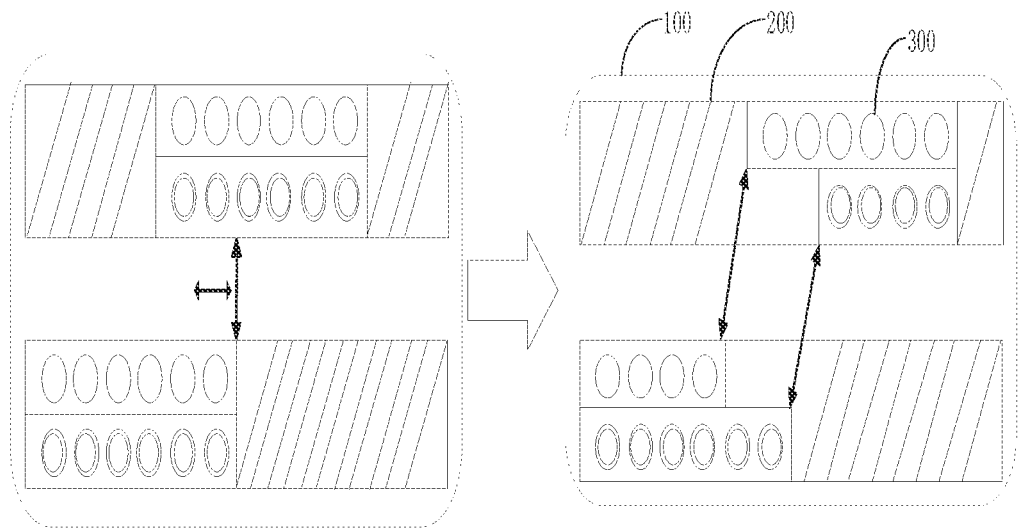
FIG. 4 is a structural diagram of comparison before and after a third improvement of the array substrate according to an embodiment of the present application.

As shown in FIG. 4, in an embodiment, on a basis of reducing the number of the through holes 300 in adjacent areas, the horizontal and vertical distances between the through holes 300 are adjusted at the same time. The through holes 300 are optimized and adjusted from multiple dimensions, which can further reduce the possibility of causing the short-circuiting.

TABLE 1

Comparison table of signal lines design of different GOA products

| | Product | | | | | |
|---|---|---|---|---|---|---|
| | 65D02 | 65D01 | 32B04 | 55D08 | 55D07 | 32B03 |
| Total width of GOA signal lines 200 | 735 | 816 | 610 | 545 | 777 | 608 |

TABLE 1-continued

Comparison table of signal lines design of different GOA products

| | Product | | | | | |
|---|---|---|---|---|---|---|
| | 65D02 | 65D01 | 32B04 | 55D08 | 55D07 | 32B03 |
| Length of through holes 300 | 536 | 670 | 220 | 285 | 106 | 133 |
| Width of through holes 300 | 78 | 47 | 76 | 58 | 82 | 49 |
| Area occupied by through holes 300 | 41971 | 31651 | 16683 | 16633 | 8673 | 6483 |
| Whether through holes 300 overlap with each other | Yes | Yes | No | No | No | No |
| Left and right spacing of GOA signal lines 200 | −170 | −300 | 139 | 26 | 205 | 231 |
| Top and bottom spacing of GOA signal lines 200 | 19 | 61 | — | 9 | 16 | — |
| Ratio of area of through holes 300 to area of GOA signal lines 200 | 15.63% | 10.49% | 7.62% | 9.83% | 3.59% | 2.93% |
| Possibility of causing burn-in | 0.20% | 0.11% | 0.01% | 0.00% | 0.00% | 0.00% |
| Whether through holes 300 and frame adhesive 400 overlap with each other | Yes | Yes | Yes | No | No | Yes |

Unit: micron

Figure 3:
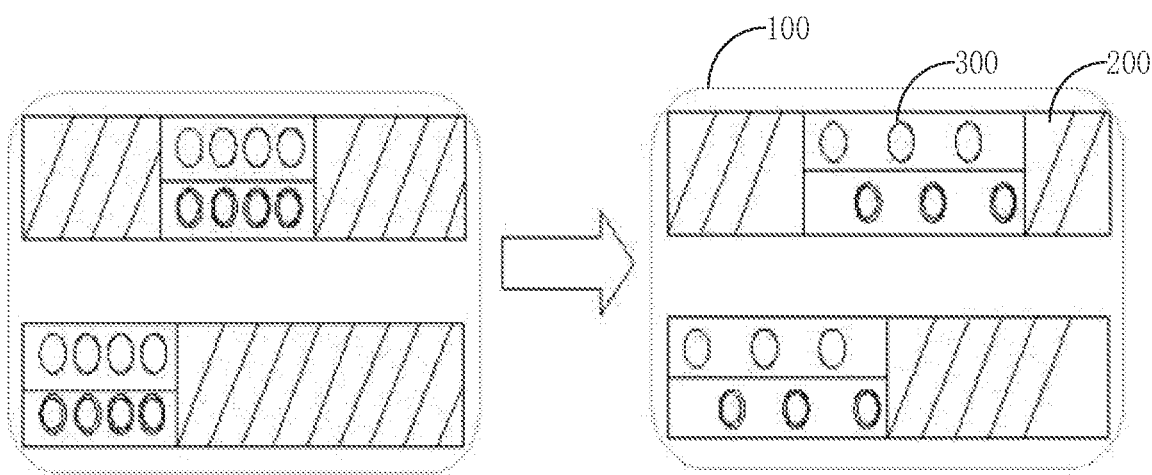
FIG. 3 is a structural diagram of comparison before and after a second improvement of the array substrate according to an embodiment of the present application.

As shown in FIG. 3, in an embodiment, the positional relationship further includes a dislocation distribution of the through holes 300 on adjacent rows when two or more rows of the through holes 300 are disposed on a same GOA signal line 200.

Specifically, the dislocation distribution of the through holes 300 can increase a distance in a certain direction or improve the arrangement density of the through holes 300 in the unit area of the GOA signal lines 200. In this way, the difficulty of connecting the adjacent through holes 300 is increased, thereby reducing the possibility of causing the short-circuiting.

In an embodiment, the array substrate 100 further includes film pillars disposed at ends of the through holes 300.

Specifically, the film pillars disposed at ends of the through holes 300 can block hollow parts of the through holes 300, which prevents the foreign objects from entering them, reduces contacts of the foreign objects with the through holes 300 during forming processes of liquid crystal cell, and protect the through holes 300 to reduce a possibility of squeezing occurred to each other.

Figure 7:
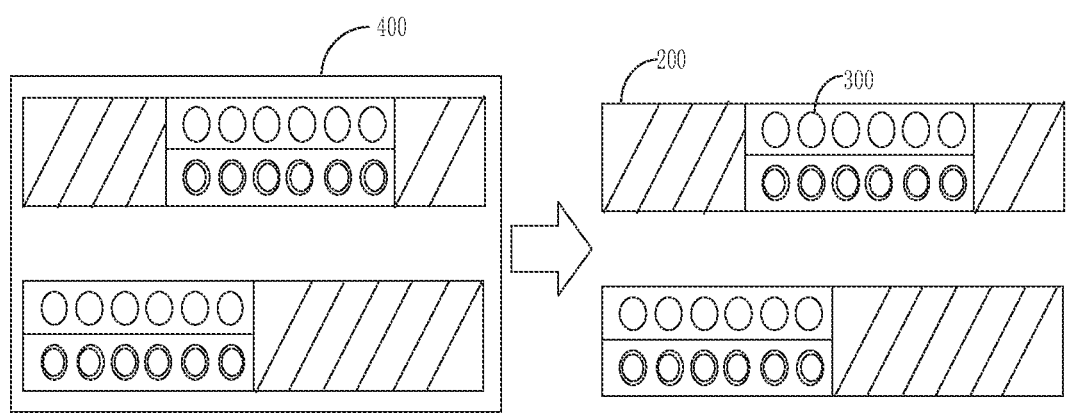
FIG. 7 is a structural diagram of comparison before and after a sixth improvement of the array substrate according to an embodiment of the present application.

As shown in FIG. 7, in an embodiment, the present application provides a display panel including any one of the above array substrates 100. The array substrate 100 is bonded to a color filter substrate by a frame adhesive 400. A coating region of the frame adhesive 400 and a wiring region of GOA signal lines 200 are independent from each other on a projection plane.

Specifically, the wiring region of the GOA signal lines 200 can be marked in advance on the TFT substrate. The frame adhesive 400 can be coated according to marks of the wiring region of the GOA signal lines 200 and coated away from the wiring region. In this way, the coating region of the frame adhesive 400 does not overlap with the wiring region on the projection plane, which achieves a purpose that the two regions do not intersect and are independent from each other. At the same time, the frame adhesive 400 is prevented from overlapping with the through holes 300.

As shown in FIG. 2, products D08 OCP and 65D01-3Q22 have no overlap between the frame 400 and signal lines. Possibilities of causing the screen burn-in of the two are significantly lower than the other two products having overlaps.

TABLE 2

Comparison table of whether frame adhesive 400 overlaps (OVL) with signal lines

| Product | loss | seal OVL |
|---|---|---|
| D08 OCP | 0.00% | No |
| D08 3601 | 0.30% | Yes |
| 65D01-3601 | 0.11% | Yes |
| 65D01-3Q22 | 0.01% | No |

The loss is the possibility of causing the burn-in, and the seal OVL is that whether the frame adhesive 400 overlaps with the signal lines.

According to an analysis of burn-in of polarizers, it was found that a majority of burn-in of the polarizer were caused by foreign objects in the frame adhesive 400. As shown in FIG. 2, products D08 OCP and D08 3601 are same products with a same array design, and products 65D01-3601 and 65D01-3Q22 are same products with a same array design. After analyzing the burn-in of the polarizers, it can be concluded that a non-overlapping design of the frame adhesive 400 and the GOA signal lines 200 can effectively reduce a possibility of causing contacts of the foreign objects in the frame adhesive 400 with the through holes 300, which reduces the possibility of causing connection between the foreign objects in the frame adhesive 400 and the CF substrate and effectively reduce a possibility of causing the burn-in of the polarizers.

The array substrate 100 provided by the present application adjusts distances between the through holes 300 on the GOA signal lines 200 and the area occupied by the through holes 300 on the GOA signal lines 200 by determining the area ratio of the through holes 300 on the GOA signal lines 200. It effectively reduces a possibility of the short-circuiting between adjacent through holes 300 caused by foreign objects, which means that a possibility of causing the short-circuiting in the region of the GOA signal lines 200 is reduced. In the display panel provided by the present application, the coating region of the frame adhesive 400 does not overlap with the wiring region of the GOA signal lines 200, a possibility of the foreign objects falling off from the coating region entering the wiring region is reduced, and a possibility of the short-circuiting caused by the foreign objects in the wiring region, thereby reducing the screen burn-in.

In the above embodiments, the description of each embodiment has its own emphasis. For a part that is not described in detail in one embodiment, reference may be made to related descriptions in other embodiments.

Although the present application has been disclosed above by the preferred embodiments, the preferred embodiments are not intended to limit the application. One of ordinary skill in the art, without departing from the spirit and scope of the present application, can make various modifications and variations of the present application. Therefore, the scope of the claims to define the scope of equivalents.

What is claimed is:

1. An array substrate, comprising:
   gate on array (GOA) signal lines disposed in a film layer of the array substrate; and
   driving signal lines disposed on a surface of the array substrate;
   wherein the GOA signal lines are electrically connected to the driving signal lines by through holes;
   the through holes are correspondingly disposed on the GOA signal lines, and the through holes are disposed on the GOA signal lines according to an area ratio; and
   the through holes disposed on the GOA signal lines according to the area ratio comprises: a ratio of an area of the through holes to an area of the GOA signal lines, and the ratio of the area of the through holes to the area of the GOA signal lines is less than eight percent.

2. The array substrate according to claim 1, wherein the through holes disposed on the GOA signal lines according to the area ratio further comprises: a ratio of an area occupied by the through holes in a unit area of the GOA signal lines to the unit area of the GOA signal lines, and the ratio of the area occupied by the through holes in the unit area of the GOA signal lines to the unit area of the GOA signal lines is related to a positional relationship of the through holes in the unit area of the GOA signal lines.

3. The array substrate according to claim 2, wherein the positional relationship comprises a lateral distance between adjacent through holes; and
   the lateral distance is a horizontal distance between outer edges of the adjacent through holes, and the lateral distance is greater than 26 microns.

4. The array substrate according to claim 2, wherein the positional relationship comprises a longitudinal distance between adjacent through holes; and
   the longitudinal distance is a vertical distance between outer edges of the adjacent through holes, and the longitudinal distance is greater than 19 microns.

5. The array substrate according to claim 2, wherein the positional relationship comprises a dislocation distribution of the through holes on adjacent rows when two or more rows of the through holes are disposed on a same GOA signal line.

6. The array substrate according to claim 1, further comprising film pillars disposed at ends of the through holes.

7. A display panel, comprising an array substrate;
   wherein the array substrate is bonded to a color filter substrate by a frame adhesive; and
   a coating region of the frame adhesive and a wiring region of gate on array (GOA) signal lines are independent from each other on a projection plane;
   wherein the array substrate comprises:
   gate on array (GOA) signal lines disposed in a film layer of the array substrate; and
   driving signal lines disposed on a surface of the array substrate;
   wherein the GOA signal lines are electrically connected to the driving signal lines by through holes;
   the through holes are correspondingly disposed on the GOA signal lines, and the through holes are disposed on the GOA signal lines according to an area ratio; and
   the through holes disposed on the GOA signal lines according to the area ratio comprises: a ratio of an area of the through holes to an area of the GOA signal lines, and the ratio of the area of the through holes to the area of the GOA signal lines is less than eight percent.

8. The display panel according to claim 7, wherein the through holes disposed on the GOA signal lines according to the area ratio comprises: a ratio of an area occupied by the through holes in a unit area of the GOA signal lines to the unit area of the GOA signal lines, and the ratio of the area occupied by the through holes in the unit area of the GOA signal lines to the unit area of the GOA signal lines is related to a positional relationship of the through holes in the unit area of the GOA signal lines.

9. The display panel according to claim 8, wherein the positional relationship comprises a lateral distance between adjacent through holes; and
   the lateral distance is a horizontal distance between outer edges of the adjacent through holes, and the lateral distance is greater than 26 microns.

10. The display panel according to claim 8, wherein the positional relationship comprises a longitudinal distance between adjacent through holes; and
    the longitudinal distance is a vertical distance between outer edges of the adjacent through holes, and the longitudinal distance is greater than 19 microns.

11. The display panel according to claim 8, wherein the positional relationship comprises a dislocation distribution of the through holes on adjacent rows when two or more rows of the through holes are disposed on a same GOA signal line.

* * * * *